United States Patent [19]
Candy

[11] 3,820,111
[45] June 25, 1974

[54] ANALOG-TO-DIGITAL CONVERTER

[75] Inventor: James Charles Candy, Convent Station, N.J.

[73] Assignee: Bell Telephone Laboratories Incorporated, Murray Hill, N.J.

[22] Filed: Nov. 13, 1972

[21] Appl. No.: 305,977

[52] U.S. Cl. ........... 340/347 AD, 235/173, 235/183
[51] Int. Cl. ........................................... H03k 13/00
[58] Field of Search...... 340/347 AD; 235/154, 183, 235/150.51, 173

[56] References Cited

UNITED STATES PATENTS

| | | | |
|---|---|---|---|
| 3,182,181 | 5/1965 | Schumann | 235/183 U X |
| 3,192,371 | 6/1965 | Brahm | 340/347 AD X |
| 3,284,794 | 11/1966 | Bean | 340/347 AD |

OTHER PUBLICATIONS

Burn–Brown Research Corp. "Handbook of Operational Amplifier Applications" 1963 pg. 53.

*Primary Examiner*—Charles D. Miller
*Attorney, Agent, or Firm*—Daniel D. Dubosky

[57] ABSTRACT

An analog signal to be converted is coupled to one input of a subtraction circuit, a second input of which is connected to receive the analog equivalent of a previously established digital word. The output of the subtraction circuit is directly connected to an integrator, the potential in which is connected to the input of a threshold classifier circuit. The classifier circuit generates an output in response to each clock pulse from a clock generator, and this output is coupled both to the above-mentioned second input of the subtraction circuit and to the input of a binary converter. The digital words formed by the binary converter are coupled to the input of a digital averaging circuit, the output of which provides the output digital word. Where the threshold classifier establishes M voltage ranges for the input analog signal, averaging of N digital words from the binary converter provides an output digital word whose accuracy is equivalent to N times M quantization levels.

1 Claim, 3 Drawing Figures

ANALOG-TO-DIGITAL CONVERTER

BACKGROUND OF THE INVENTION

This invention relates to analog-to-digital converters and, more particularly, to an analog-to-digital converter in which the analog quantity is converted to a digital word having several digit positions.

In order to convert analog signals to a large number of digits, a straightforward analog-to-digital conversion requires a relatively large number of threshold circuits. For example, in order to convert a video signal into digital words having eight bits, thereby representing any one of 256 levels, straightforward analog-to-digital conversion would require 256 threshold circuits. In order to reduce the number of required threshold circuits, some prior art encoders have broken the conversion process up into several steps. First, the analog quantity is converted by a first set of threshold circuits into a coarsely quantized digital word thereby establishing the digits for the most significant bits. In a second step, the difference between the analog quantity and the analog value represented by the corasely quantized digital word is amplified and presented to a second set of threshold circuits in order to establish the least significant digital bits. This process of two-step conversion requiring amplification of the difference between the analog value and a coarsely quantized digital word has been found to be unreliable due to the high precision required of the circuits.

In another prior art analog-to-digital encoder shown in U.S. Pat. No. 3,560,957 of Feb. 2, 1971 to Takeo Miura et al. the analog quantity $e_n$ is converted in a successive-approximation type analog-to-digital converter and the resulting difference between the developed digital word and that quantity $e_n$ is sampled and held in a first sample and hold circuit. This difference is then added to the input analog signal $e_i$ and the result of the summation is sampled and held in another sample and hold circuit. The quantity held in the second sample and hold circuit is the quantity $e_n$ which is then used in the next development of a digital word. As indicated in the Miura et al. patent, the average of the digital words which results from this type of conversion approaches the average of the input analog samples with an accuracy which increases as the number of digital words increases. With $n$ digital words entering into the averaging process, the difference between the average of the input samples and the average of the digital words is always less than $1/n$ times one quantization level.

Another analog-to-digital encoder which develops digital words, the average value of which produces the average of the input analog sample, is described in my article with R. C. Brainard entitled "Direct-Feedback Coders: Design and Performance With Television Signals," *Proceedings of the IEEE*, Vol. 57, No. 5, May, 1969, pages 776–786. In this type of direct-feedback coder, the difference between an input analog signal and the developed digital word is established in a subtraction circuit. The output of this subtraction circuit is then sampled and the result is coupled to an accumulating amplifier. The developed potential within this amplifier is then again sampled to provide the input to the quantizer circuit which develops the digital word. In this direct-feedback coder, as in the coder described in the Miura et al. patent, sampling circuits are utilized in order to develop the potentials which are acted upon by the quantizing circuits to develop the coarsely quantized digital words. These sampling circuits have been found to be undesirable for several reasons. First, any noise present on the input signal tends to introduce an error when the sampling takes place during a noise peak. Secondly, sampling circuits present complications in that they must be operated at precise times with relation to other timed portions of the encoder. Speed of operation is also impaired since operation of the sampling circuits frequently introduces transients which must be allowed to decay before the potential after sampling may be utilized by subsequent circuits. Finally, the length or duration of the sampling interval is also critical in that the length must be precise in order to produce the same results during each operation of the gating circuit.

SUMMARY OF THE INVENTION

A primary object of the present invention is to convert an analog signal into digital form in a converter which is relatively insensitive to instabilities of gain within the converter.

Another object of the present invention is to convert an analog signal into digital form in a converter in which the number of gated functions is held to a minimum in order to remove the necessity for accurate timing between gated circuits.

Still another object of the present invention is to perform an analog-to-digital conversion in an apparatus utilizing as few a number of components as possible.

These and other objects are achieved in accordance with the present invention wherein the analog quantity to be converted is connected to one input of a subtraction circuit. A second input of a subtraction circuit is connected to receive the analog equivalent of a previously established coarsely quantized digital word. The output of the subtraction circuit is utilized to continuously change the potential in an integrator circuit in accordance with the magnitude of the difference between the analog input quantity and the previously established digital word. In response to a clock pulse, the resulting potential in the integrator circuit is converted into a new coarsely quantized digital word and its analog equivalent which is coupled back to the above-mentioned second input of the subtraction circuit. A predetermined number of the coarsely quantized digital words is averaged to provide an output digital word. Where the quantization levels represent N voltage ranges, an averaging of M digital words provides an output digital word which represents the average of the analog input quantity with an accuracy equivalent to that which is provided by N times M quantization levels.

BRIEF DESCRIPTION OF THE DRAWING

The invention will be more readily understood after reading the following detailed description in combination with the drawing wherein.

DETAILED DESCRIPTION

Figure 1:
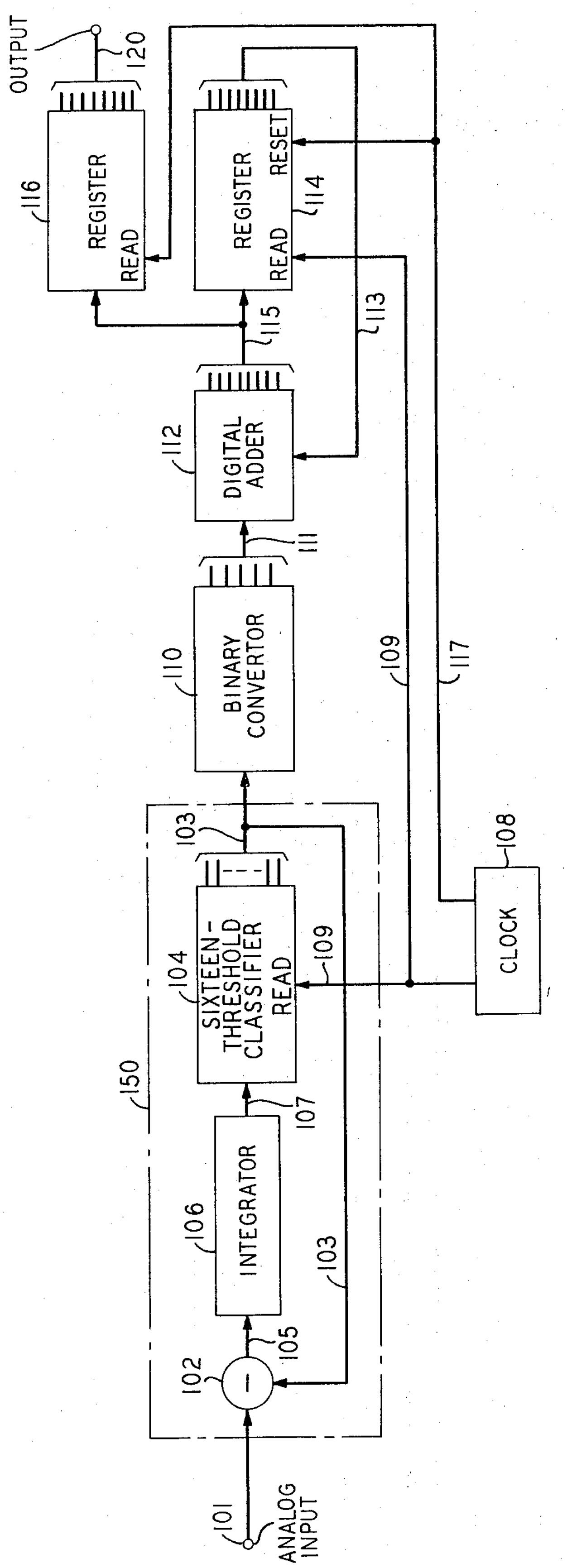
FIG. 1 is a schematic block diagram of an apparatus constructed in accordance with the present invention.

In FIG. 1, the analog signal to be converted into digital form is coupled from an input terminal 101 to one input of a subtraction circuit 102. The second input of subtraction circuit 102 is connected by way of bus 103 to the output of a 16-threshold classifier 104. By energizing a predetermined number of the 16 transmission paths present in bus 103, classifier 104 indicates which one of 17 coarse quantization levels represents the closest voltage level to the voltage presented to its input. Classifier 104 is designed to represent the entire range of voltages which are expected to be coupled to input terminal 101. The most positive voltage is represented by classifier 104 with a zero voltage level on all of its 16 output leads, whereas the most negative voltage is represented by classifier 104 with a predetermined voltage level present on all of its 16 output leads. The absence of a voltage level at any one of the output leads of classifier 104 indicates that the voltage at the input to the classifier is in excess of the threshold level corresponding to that lead. In this way, classifier 104 presents a collection of voltage levels to the second input of subtraction circuit 102 which represents a particular one of the quantization levels within classifier circuit 104.

The output of subtraction circuit 102 is directly coupled to an integrator circuit 106 without any intervening gating or sampling circuitry as in the prior art, thereby removing the necessity for any accurately timed gating or sampling pulse. In addition, the effect of any high frequency noise present on the input analog signal is removed by the operation of integrator circuit 106.

If the analog voltage present at input terminal 101 is more positive than the analog voltage represented by voltage levels on bus 103, subtraction circuit 102 delivers a charging current by way of path 105 to the input of an integrator circuit 106, thereby causing integrator 106 to charge to a higher potential. If, on the other hand, the analog voltage present at input terminal 101 is less positive than the potential represented by the voltage levels on bus 103, then subtraction circuit 102 causes integrator circuit 106 to discharge toward a less positive potential. The resultant voltage present within integrator circuit 106 is constantly coupled by way of path 107 to the input of the 16-threshold classifier circuit 104.

During the initial rise of each clock pulse presented to a clock input of classifier 104 by a clock circuit 108 on line 109, classifier 104 responds to the potential present at the output of integrator circuit 106 and develops a set of voltage levels on bus 103 which corresponds to the quantization level closest in magnitude to the potential presented by integrator circuit 106. Hence, the circuit configuration provided by subtractor circuit 102, integrator circuit 106 and the 16-threshold classifier circuit 104 is a negative feedback circuit arrangement which is permitted to readjust the quantization level provided by the output of classifier circuit 104 in accordance with the error signal provided by integrator circuit 106 during each instant that the clock pulse is provided by clock circuit 108 on path 109. When the potential provided at the input terminal 101 is more positive than the quantization level represented by the voltage levels on bus 103, the potential within integrator circuit 106 is increased by the error signal coupled from the output of subtractor circuit 102. This increase eventually results in producing an input at the classifier circuit 104 which causes the next higher quantization level to be represented by the voltage levels on bus 103. At this point the voltage present at input terminal 101 may be less than the voltage represented by the quantization level on bus 103 and the potential within integrator circuit 106 will then be discharged or reduced in magnitude by the error signal present at the output of subtractor circuit 102.

The 16 paths present on bus 103 at the output of classifier circuit 104 actually provide an indication of 17 quantization levels. As indicated hereinabove, the complete absence of voltage levels on each of the paths within bus 103 is caused to represent the most positive potential to be presented at input terminal 101. Each of the paths present on bus 103 represents a quantization level higher than the one represented when all of the paths are presented with the predetermined voltage level. A path in bus 103 is de-energized to zero voltage level when the potential presented by integrator 106 is greater than or equal to the quantization level corresponding to that path. As will be apparent after the invention is more completely described, the 17 coarse quantization levels represented by the 16 outputs of classifier circuit 104 are designed to bracket the voltage range expected to be present at the input terminal 101, and the position of an input analog sample in the voltage range between two adjacent quantization levels is delineated by the circuits to follow in the apparatus.

Each of the paths present in bus 103 is coupled to the input of a binary converter 110. In response to the presence and absence of voltage levels on the 16 paths present in bus 103, binary converter 110 produces a 5-bit digital word on bus 111. Five bits are, of course, necessary in order to specify each one of the 17 quantization levels that are indicated by the voltage levels present at the output of classifier circuit 104. In the apparatus described thus far, the average of the digital words presented at the output of binary converter 110 will equal the average of the analog values presented to input terminal 101 with an accuracy which increases with the number of digital words taken into the average. It can be shown mathematically that the difference between the average of N input analog values and the average of N of the coarsely quantized digital words is less than $\xi/N$ where $\xi$ is equal to one-half of the voltage range between adjacent quantization levels.

The apparatus illustrated in the drawing was constructed to transform an analog video signal into an 8-bit digital word, thereby representing the analog video signal with an accuracy equivalent to 256 quantization levels. To accomplish this end, 16 of the digital words presented on bus 111 must be averaged in order to provide an 8-bit digital output. This averaging of the 16 coarsely quantized digital words provided by the binary converter 110 in a sense further delineates the 16 voltage ranges between the 17 quantization levels inherent in the operation of classifier circuit 104. Since the averaging of 16 digital words in the binary system simply means a shift in the decimal place of the sum of the digital words, the digital words present on bus 111 are advantageously averaged in the present apparatus by sequentially adding each digital word in a sequence of 16 digital words to the previous sum developed in the sequence.

Each digital word on bus 111 is coupled to one input of digital adder circuit 112. A second input of digital adder circuit 112 is connected by way of bus 113 to receive the 8-bit digital word present in a register 114. The sum provided on bus 115 by digital adder circuit 112 is coupled both to the input of register 114 and to the input of a second register 115. In response to the voltage rise of a digital clock pulse from clock circuit 108 at their respective read inputs, registers 114 and 115 store the 8-bit digital word present on bus 115. Register 114 is reset to zero in response to the flat voltage top of each clock pulse coupled to its reset input.

Figure 2:
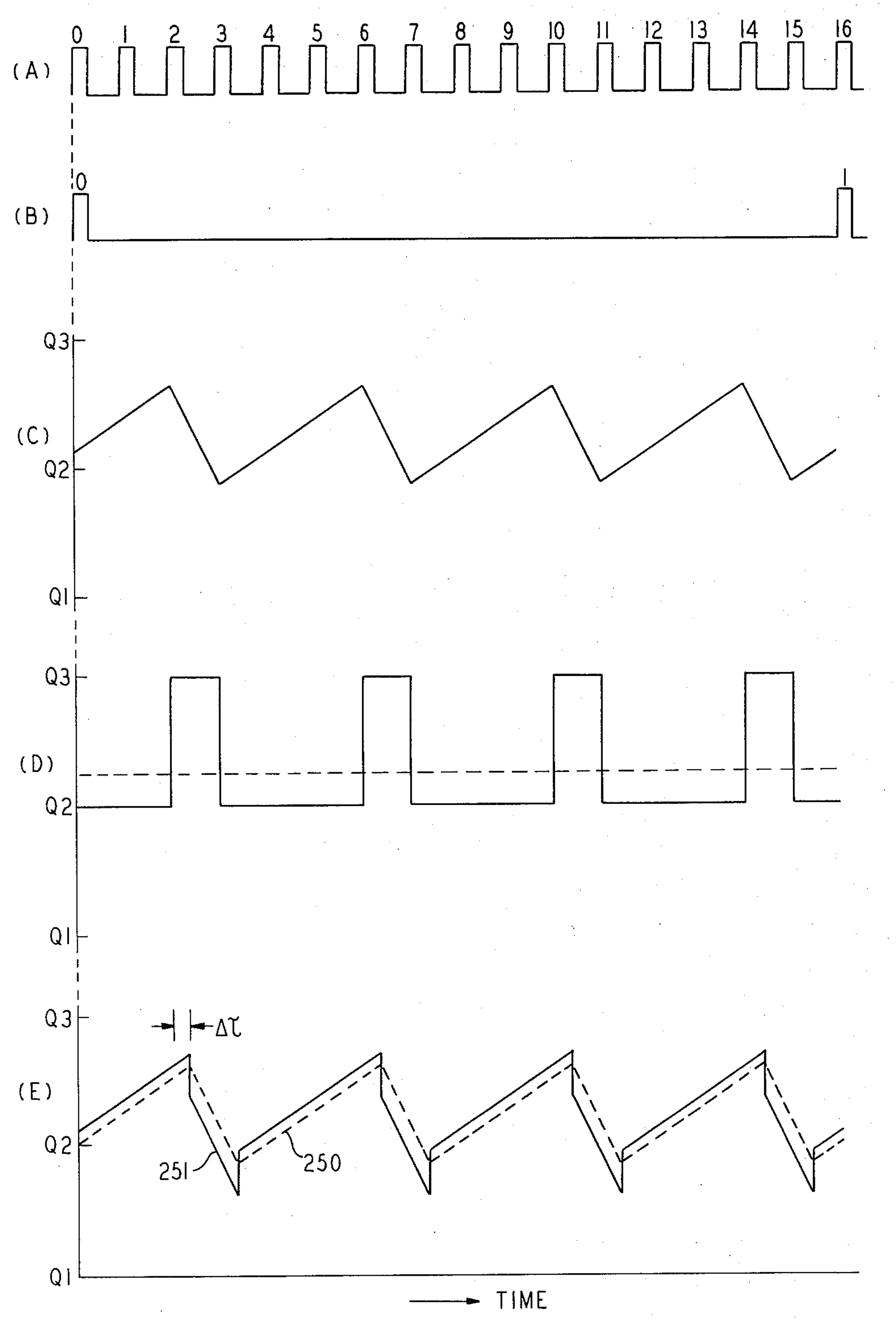
FIG. 2 is a family of waveforms useful in describing the operation of the apparatus illustrated in FIGS. 1 and 3.

The operation of the apparatus in FIG. 1 can be more completely described by referring to the waveforms shown in FIG. 2. All of the waveforms in FIG. 2 are plots of voltage versus time. The happening of significant events in each of the waveforms can be referred to by designating the pulses generated by the clock generator 108 on line 109. These clock pulses from line 109 are represented by the voltage pulses in waveform A of FIG. 2 which are numbered zero through 16 with the sixteenth pulse being equivalent to the zeroth pulse in the next complete cycle of operation. For each 16 pulses generated on line 109, clock generator 108 also generates a single voltage pulse on line 117 as shown in waveform B of FIG. 2.

The operation illustrated in the FIG. 2 waveforms corresponds to the situation where a constant voltage is present at input terminal 101. The magnitude of this voltage corresponds to a voltage level which is one-quarter of the distance between the Q2 and Q3 quantization levels. For purposes of the explanation, it has been assumed that the voltage present in integrator circuit 106 at the initiation of the cycle illustrated in FIG. 2 is equal to a voltage equivalent to the Q2 quantization level plus one-eighth of the distance between the Q2 and Q3 quantization levels. As will be apparent to those skilled in the art after a description of the operation is complete, this initial potential in integrator circuit 106 is in no way critical and initial potentials other than the one assumed will simply cause waveforms C and D to be shifted in phase.

In response to the voltage rise of the zeroth pulse in waveform A on line 109, classifier circuit 104 develops the voltage level equivalent to the Q2 quantization level on bus 103. This quantization level is represented since at this time a potential equivalent to one-eighth of the distance between the Q2 and Q3 quantization levels is presented by integrator circuit 106 on line 107. The quantization level represented by the voltage levels on bus 103 and, therefore, the binary words developed by converter 110 are represented in waveform D of FIG. 2. Also shown in waveform D is a dotted line representing the constant input voltage applied to input terminal 101 during this series of waveforms. As indicated in waveform D, subtractor circuit 102 develops an error signal whose magnitude is equal to one-quarter of the voltage difference between the quantization levels Q2 and Q3. This error signal will cause the potential in integrator circuit 106 to rise at a rate such that the potential provided by this integrator circuit will be at a voltage level at the beginning of the next clock pulse equal in magnitude to the Q2 quantization level plus three-eighths of the difference between the Q2 and Q3 quantization levels. This new voltage level is, of course, higher in magnitude than the voltage level at the beginning of the zeroth pulse by a value equal to one-quarter of the voltage difference between the quantization levels.

The binary number that corresponds with level Q2 is fed via bus 111 to adder circuit 112. A zero signal is present on the other input bus 113 because the flat top voltage of the zeroth pulse in waveform B of FIG. 2 resets register 114 to its zero position. Accordingly, when the initial voltage rise provided by pulse 1 in waveform A of FIG. 2 is coupled to the read input of register 114, the unaltered value of the digital word, Q2, on bus 111 is coupled through digital adder 112 into register 114. The value is unaltered since register 114 at this instant presents an all-zero digital word to the second input of digital adder 112. In response to the voltage rise of pulse 1 in waveform A of FIG. 2, classifier circuit 104 also redevelops the voltage level equivalent to quantization level Q2 on its output bus 103. The quantization level Q2 is still chosen since the potential in integrator circuit 106 at this instant is not yet greater than the potential which is one-half of the distance between quantization levels Q2 and Q3. Consequently, the error signal from subtractor circuit 102 still causes the potential in integrator circuit 106 to rise at a rate equal to one-quarter of the voltage range over an interval equal to the period of the pulses in waveform A.

Before the voltage rise occurs in pulse 2 of waveform A in FIG. 2, the digital word developed by converter 110 during pulse 1 is added in adder circuit 112 to the digital word stored in register 114 from the pulse zero interval. This summation of the digital words developed during the zeroth and first pulses is read into register 114 in response to the voltage rise presented by pulse 2 in waveform A. During the instant when this voltage rise on pulse 2 occurs, the potential in integrator 106 is at a voltage level equivalent to five-eighths of the distance between the quantization levels Q2 and Q3. Accordingly, in response to this voltage rise of pulse 2, classifier circuit 104 develops voltage levels on bus 103 equivalent to the Q3 quantization level since the potential in the integrator circuit is now closer to the Q3 quantization level than it is to the Q2 quantization level. This change in the quantization level represented by both the voltage levels on bus 103 and by the digital word on bus 111 is illustrated in waveform D of FIG. 2.

After the voltage rise on pulse 2 of waveform A, the analog voltage at input terminal 101 is less than the voltage equivalent of the voltage levels on bus 103 by three-quarters of the voltage difference between the Q2 and Q3 quantization levels. In response to this voltage difference, the potential in integrator circuit 106 is decreased at a rate which changes the potential by three-quarters of the voltage difference over a time interval equal to the period of the pulses of waveform A. Consequently, when the voltage rise on pulse 3 of waveform A occurs, the potential in integrator circuit 106 is at a magnitude equal to the Q2 quantization level less one-eighth difference between the Q2 and Q3 quantization levels. Hence, in response to the pulse 3 voltage rise, classifier circuit 104 once again develops voltage levels on bus 103 equivalent to the Q2 quantization level. At this point the analog input voltage at input terminal 101 is again greater than the voltage equivalent of the voltage levels on bus 103 and the potential in integrator circuit 106 is again increased at a rate equivalent to one-quarter of the voltage difference between quantization levels over the interval between clock pulse voltage rises. This process of alternately increasing and decreasing the potential in integrator circuit 106 at a rate dictated by the error signal on line 105 continues through the cycle up to and including the fifteenth pulse in waveform A of FIG. 2. The potentials established in integrator circuit 106 result in the production of digital words by converter 110 equal to the Q2 quantization level during three-quarters of the pulses and equal to the Q3 quantization level during one-quarter of the pulses.

During each of the voltage rises in pulses 1 through 15, the summation provided by digital adder circuit 112 on bus 115 is read into register 114. During the initial rise of potential presented by pulse 16 in waveform A of FIG. 2, the summation of all of the digital words developed by converter 110 during the clock pulses 0 through 15 is available on bus 115 at the output of digital adder circuit 112. The initial rise of voltage provided by pulse 1 in waveform B to the read input of register 116 causes this summation of the 16 digital words to be coupled into register 116 thereby providing this summation word as an output digital word on bus 120. The initial rise of potential in pulse 16 of waveform A also causes this summation to be read into register 114 but this summation is almost immediately cleared in response to the flat top voltage of pulse 1 of waveform B at the reset input of register 114. In this way, register 114 is reset to its zero state in anticipation of receiving the digital word developed by classifier 104 during the initial rise of the sixteenth pulse in waveform A of FIG. 2. As indicated hereinabove, this sixteenth pulse corresponds to the zeroth pulse in waveform A in that it is the beginning of a new cycle of operation.

Figure 3:
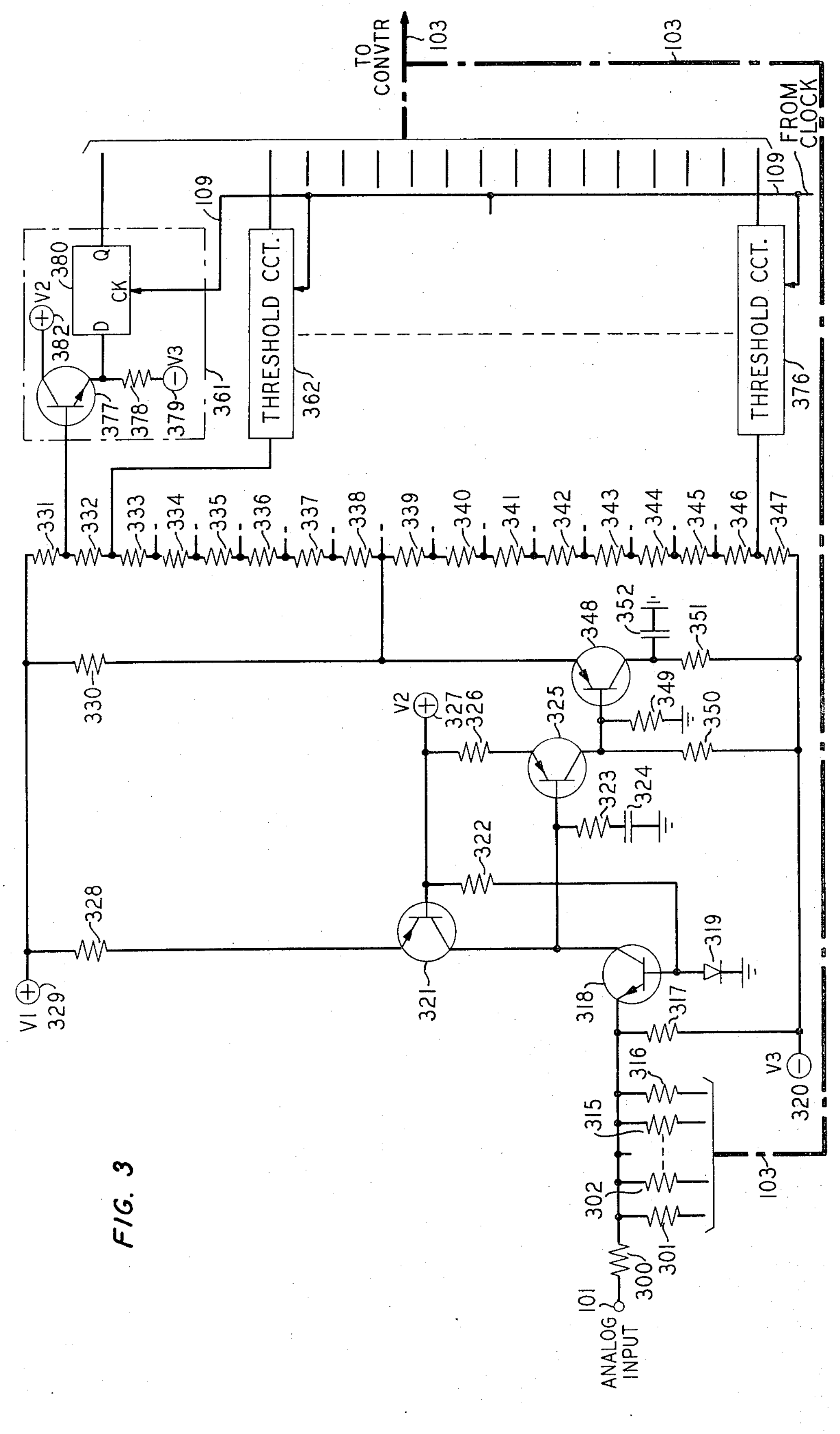
FIG. 3 is a detailed schematic diagram of a group of circuits which are shown simply as boxes in FIG. 1.

A schematic diagram of a circuit configuration which may be utilized to perform the functions of the circuits shown within box 150 of FIG. 1 is shown in FIG. 3 of the drawing. This circuit configuration includes subtraction circuit 102, integrator circuit 106 and 16-threshold classifier circuit 104. The circuit shown in FIG. 3 was designed to work with a video signal at its input terminal 101 which is negative in potential for all values of the video signal, the most positive potential being equal to zero volts.

In FIG. 3, the video signal at input terminal 101 is connected by way of a resistor 300 to the emitter electrode of a transistor 318. Also connected to the emitter of transistor 318 are resistors 301 through 316. Each of the other terminals of resistors 301 through 316 is connected to one of the transmission paths in bus 103. As will be apparent hereinafter, each of these transmission paths provides either zero potential or a predetermined voltage level to one of the resistors 301 through 316. When the video signal at analog input terminal 101 presents zero voltage at the input, no current is drawn through resistor 300. Similarly, with zero voltage on each of the transmission paths in bus 103, no current is provided through any one of the resistors 301 through 316.

A positive potential source 327 provides a forward-biased current for a diode 319 through a resistor 322. The anode of diode 319 thereby presents a positive potential with respect to ground to the base electrode of transistor 318, which potential is equal in magnitude to the conduction drop of diode 319. The emitter of transistor 318 is connected through a resistor 317 to negative potential source 320. Current flowing from positive potential source 327 through resistor 322 and through the base-emitter junction of transistor 318 causes this transistor to always be forward-biased. Since the base-emitter junction of transistor 318 has the same potential drop as diode 319, the emitter of transistor 318 is always at a potential very close to zero volts with respect to ground.

A positive potential source 329 is connected through resistor 328 to the emitter electrode of a transistor 321, the base of which is connected to positive potential source 327. Since the potential V1 of potential source 329 is greater than the potential V2 of potential source 327, the base-emitter junction of transistor 321 is forward-biased and the current flowing out of the collector electrode of transistor 321 is coupled to the collector electrode of transistor 318. A series circuit consisting of resistor 323 and capacitor 324 is connected from the junction of the collector electrodes of transistors 321 and 318 to ground. Capacitor 324 is thereby charged or discharged by the excess or deficiency of any current at the junction of the collector electrodes of transistors 318 and 321.

When the current drawn through resistor 300 by the input analog signal is exactly equal to the current provided through resistors 301 through 316, the value of resistor 317 is chosen such that the current flowing into the collector electrode of transistor 318 is exactly equal to the current provided out of the collector electrode of transistor 321. When the input analog voltage is at its most negative potential, the values of resistors 300 through 316 are chosen such that the current drawn through resistor 300 by the input analog signal is equal to the current provided through resistors 301 through 316 when the predetermined voltage level is present on every one of the transmission paths in bus 103. Hence, every magnitude potential in the input analog signal can be thought of as having an analog equivalent represented by the number of transmission paths energized by a predetermined voltage level in bus 103.

When the current drawn through resistor 300 is less than the current provided through resistors 301 through 316, the excess current from bus 103 will flow through resistor 317 and decrease the amount of current drawn by the collector of transistor 318. Accordingly, some of the current from the collector electrode of transistor 321 is diverted from transistor 318 and this current flows through resistor 323 to charge capacitor 324. If, on the other hand, the current drawn through resistor 300 is greater than the current provided through resistors 301 through 316, more current than that which is flowing through resistor 317 is drawn through the collector of transistor 318 and this results in a current drain from capacitor 324 through resistor 323, thereby discharging capacitor 324.

In summary, the potential on capacitor 324 remains constant only when the input analog signal is equal in magnitude to its analog equivalent on bus 103. For all other conditions where the input analog signal is greater or less than its analog equivalent on bus 103, the potential on capacitor 324 is changed.

The potential across the series circuit consisting of resistor 323 and capacitor 324 is coupled to the base electrode of a transistor 325. Connection of the emitter electrode of transistor 325 through a resistor 326 to positive potential source 327 and connection of the collector electrode of transistor 325 through resistor 350 to negative potential source 320 causes this transistor 325 to be connected in a common-emitter amplifier configuration. Resistor 349 is connected between the collector electrode of transistor 325 and ground potential solely for the purpose of modifying the gain provided by this common-emitter amplifier to a value which will result in an overall loop gain close to unity. This loop gain is in no way critical, however, inasmuch as values for loop gain of anywhere between 0.5 and 1.3 have been found to be completely satisfactory. The output signal available at the collector electrode of transistor 325 is coupled through an emitter-follower circuit including transistor 348, resistors 330 and 351, and capacitor 352, to thereby provide an output voltage on the emitter electrode of transistor 348.

A series resistance structure including resistors 331 through 347 is connected between positive potential source 329 and negative potential source 320. The emitter of transistor 348 is connected to the junction of resistors 338 and 339 in the series resistance structure including resistors 331 through 347. With the potential from potential source 329 equal in magnitude to the potential from negative potential source 320, resistor values are chosen for the series resistance of structure such that the potential developed at the emitter of transistor 348 can swing to the point where either a positive potential in excess of about 1 volt or a potential of less than 1 volt can be developed at all of the junctions between resistors in the series resistance structure of resistors 331 through 347. Each junction of two resistors in the series resistance structure is connected to one of sixteen threshold circuits 361 through 376. Each of the threshold circuits is identical in structure to each of the others and, therefore, only one of the threshold circuits, designated as 361, is shown in detail.

The connection from the junction of two resistors is connected in threshold circuit 361 to the base electrode of a transistor 377 which is connected as an emitter-follower. This emitter-follower serves to decouple a D-type flip-flop 380 from the junction of the two resistors in the series resistance structure. This decoupling prevents spurious transients developed in the D-type flip-flop from being coupled back into other threshold circuits.

Each of the D-type flip-flops in threshold circuits 361 through 376 has a clock input which is coupled by way of line 109 to receive the clock pulses from clock generator 108. If the potential at the D input of the D-type flip-flop is in excess of a threshold of 1 volt, appearance of a clock pulse on line 109 will cause that D flip-flop to develop a predetermined voltage level at its Q output. If, on the other hand, the voltage at the D input is lower than the threshold level, appearance of a clock pulse will cause the D-type flip-flop to generate zero voltage level at its Q output.

The 180° phase reversal present in the common-emitter amplifier including transistor 325 results in the production of all zero voltages on the transmission paths of bus 103 when the video signal at input terminal 101 is at 0 volts and a predetermined voltage level on all of the paths in bus 103 when the video signal at input terminal 101 is at its maximum negative potential. The output from the Q terminal of each of the D flip-flops in threshold circuits 361 through 376 is connected to one of the paths in bus 103. As indicated hereinabove, each one of these transmission paths in bus 103 is connected back to one of the resistors 301 through 316 and also into binary converter 110. The output produced by any one of the D-type flip-flops in threshold circuits 361 through 376 is dependent solely upon the potential presented to the input of its corresponding threshold circuit when the clock pulse is generated on line 109. Any new arrangement of voltage levels on bus 103 will then cause the potential on capacitor 324 to move toward a potential which will reduce the error between the input analog signal and the equivalent analog value of the voltage levels on bus 103.

In the embodiment of FIG. 3, which was constructed to process a video signal having a 1-megahertz bandwidth, an output digital word must be generated at a 2-megahertz rate. Accordingly, the clock pulses on line 109 from generator 108 must occur at a 32-megahertz rate. At this frequency, the delay within the loop of the FIG. 3 circuit becomes significant in that operation of the D-type flip-flops will not immediately result in a change in the direction of either the charging or discharging of capacitor 324. To compensate for the delay inherent in this loop, resistor 323 is placed in series with the integrator capacitor 324. The effect that this register 323 has on the operation of the circuit can best be illustrated by referring to waveform E in FIG. 2. In waveform E, the dotted line 250 represents the potential across capacitor 324. As indicated in waveform E, the voltage rise in clock pulse 2 does not immediately result in changing from a condition of charging to a condition of discharging capacitor 324. As further indicated in waveform E, an interval designated as $\Delta\tau$ occurs before the potential across capacitor 324 changes direction. It is desirable, for proper operation of the circuit, for the peak potential developed across capacitor 324 to be available at the input of the D-type flip-flops when the voltage rise occurs in the clock pulse. To provide an anticipatory-type voltage, resistor 323 adds a voltage drop to the potential across capacitor 324 when this capacitor is being charged and provides a voltage drop which is subtracted from the voltage across capacitor 324 when this capacitor is being discharged.

The waveform present across the entire series structure including resistor 323 and capacitor 324 is represented in waveform E by the solid line 251. The potential provided across the series structure as indicated by line 251 in waveform E is equal to the peak potential developed across the capacitor at an interval of $\Delta\tau$ before that peak potential occurs. In an interval of $\Delta\tau$, the voltage across capacitor 324 will rise by a value of $\Delta V_C$ where $$\Delta V_C = dV_C/dt\ \Delta\tau \qquad (1)$$

The potential drop across resistor 323, $\Delta V_R$, is equal to the current times the magnitude of the resistance and this potential drop may be represented by the following equation:

$$\Delta V_R = CR\ dV_C/dt \qquad (2)$$

As indicated by these equations, $\Delta V_C$ can be made equal to $\Delta V_R$ by making the value of rsistor 323 equal to $(\Delta\tau/C)$. In this way, resistor 323 advantageously compensates for the delay within the loop of the circuit in FIG. 3 and a precise operation is achieved in spite of the fact that no settling time has been provided as in prior art circuits where gating circuits or sampling circuits are utilized at the input of the integrator or accumulator circuits.

What has been described hereinbefore is one illustrative embodiment which practices the present invention. Numerous modifications may be made by those skilled in the art within the spirit and scope of the present invention. For example, the polarity and direction of movement of the analog input signal may, of course, be modified by a redesign of the polarities and phase reversals within the apparatus shown in FIG. 3.

I claim:

1. An analog-to-digital converter for transforming an input analog signal into an output digital word comprising a clock generator means, quantizing means responsive to said clock generator means for converting a potential at its input into a coarsely quantized digital word and an analog value equal in magnitude to said quantized digital word, a capacitor means having a resistor and a capacitor connected in series between ground potential and a high side of said capacitor means, means for changing the potential across said capacitor means with a current which is proportional to the difference between said input analog signal and said analog value, means for coupling the potential across said capacitor means to the input of said quantizing means, and means for averaging a plurality of coarsely quantized digital words to develop said output digital word; said quantizing means for converting a potential at its input includes a classifier circuit which indicates the magnitude of said potential by energizing an appropriate number of its output terminals, and a binary converter for transforming the quantity represented by the output terminals of said classifier circuit into a binary digital word; said quantizing means further includes a plurality of resistors each one of which is connected between a different one of said output terminals and a point common to all of said plurality of resistors; and said means for changing the potential across said capacitor means includes a first and second transistor each having base, emitter and collector electrodes, said first transistor having its emitter electrode directly connected to the common point of said plurality of resistors, first resistor means for coupling said input analog signal to the emitter electrode of said first transistor, second resistor means for connecting the emitter electrode of said first transistor to a negative potential source, a diode having its anode connected to the base electrode of said first transistor and its cathode connected to ground potential, means for directly connecting the collector electrode of said first transistor to the collector electrode of said second transistor and to the high side of said capacitor means, means for forward biasing said diode from a first positive potential source, means for directly connecting the base electrode of said second transistor to said first positive potential source, and means connected to the emitter electrode of said second transistor for forward biasing the base-emitter junction of said second transistor from a second positive potential source having a higher potential than said first positive potential source.

* * * * *